(12) United States Patent
Ishiyama et al.

(10) Patent No.: US 9,917,064 B2
(45) Date of Patent: Mar. 13, 2018

(54) SEMICONDUCTOR DEVICE WITH A PLATE-SHAPED LEAD TERMINAL

(71) Applicant: Mitsubishi Electric Corporation, Tokyo (JP)

(72) Inventors: Yusuke Ishiyama, Tokyo (JP); Yuji Imoto, Tokyo (JP); Junji Fujino, Tokyo (JP); Shinsuke Asada, Tokyo (JP); Mikio Ishihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/790,682

(22) Filed: Jul. 2, 2015

(65) Prior Publication Data

US 2016/0111379 A1    Apr. 21, 2016

(30) Foreign Application Priority Data

Oct. 16, 2014    (JP) .................................. 2014-211424

(51) Int. Cl.
*H01L 23/00*    (2006.01)
*H01L 23/29*    (2006.01)
(Continued)

(52) U.S. Cl.
CPC .......... *H01L 23/562* (2013.01); *H01L 23/293* (2013.01); *H01L 23/3121* (2013.01);
(Continued)

(58) Field of Classification Search
CPC . H01L 23/3107; H01L 24/85; H01L 23/4952; H01L 23/49524; H01L 23/49838; H01L 23/5386
See application file for complete search history.

(56) References Cited

U.S. PATENT DOCUMENTS 5,430,330 A    7/1995    Takahama et al.
5,539,218 A    7/1996    Takahama et al.
(Continued)

FOREIGN PATENT DOCUMENTS

CN    1750256 A    3/2006
CN    1753170 A    3/2006
(Continued)

OTHER PUBLICATIONS

An Office Action issued by the Japanese Patent Office dated Aug. 7, 2017, which corresponds to Japanese Patent Application No. 2014-211424 and is related to U.S. Appl. No. 14/790,682; with English language translation.
(Continued)

*Primary Examiner* — Alonzo Chambliss
(74) *Attorney, Agent, or Firm* — Studebaker & Brackett PC

(57) ABSTRACT

A semiconductor device includes a semiconductor element having a lower surface bonded to an insulating substrate side, and a plate-shaped lead terminal bonded to an upper surface of the semiconductor element, and having a horizontally extending portion. The horizontally extending portion in the lead terminal is bonded to the semiconductor element and includes a linearly extending portion in a planar view. The semiconductor device further includes a sealing resin that seals the semiconductor element together with the linearly extending portion in the lead terminal. A linear expansion coefficient of the sealing resin shows a value intermediate between a linear expansion coefficient of the lead terminal and a linear expansion coefficient of the semiconductor element, and the lead terminal includes a recess or a projection to horizontally and partially separate the linearly extending portion into parts.

16 Claims, 10 Drawing Sheets

(51) Int. Cl.
*H01L 23/495* (2006.01)
*H01L 23/31* (2006.01)
*H01L 23/498* (2006.01)

(52) U.S. Cl.
CPC .... *H01L 23/4952* (2013.01); *H01L 23/49524* (2013.01); *H01L 23/49551* (2013.01); *H01L 23/49575* (2013.01); *H01L 23/49838* (2013.01); *H01L 24/37* (2013.01); *H01L 23/3107* (2013.01); *H01L 2224/05554* (2013.01); *H01L 2224/37124* (2013.01); *H01L 2224/37147* (2013.01); *H01L 2224/37599* (2013.01); *H01L 2224/40137* (2013.01); *H01L 2224/48091* (2013.01); *H01L 2224/73221* (2013.01); *H01L 2224/8385* (2013.01); *H01L 2224/83801* (2013.01); *H01L 2224/8485* (2013.01); *H01L 2224/84801* (2013.01); *H01L 2924/00014* (2013.01); *H01L 2924/181* (2013.01)

(56) References Cited

U.S. PATENT DOCUMENTS

| | | | |
|---|---|---|---|
| 7,432,594 | B2 | 10/2008 | Ashida et al. |
| 2002/0104519 | A1 | 8/2002 | Hirakawa et al. |
| 2006/0043618 | A1 | 3/2006 | Ashida et al. |
| 2006/0054901 | A1* | 3/2006 | Shoji ............... H01L 21/565 257/80 |
| 2006/0060882 | A1* | 3/2006 | Ohe ............... G02B 6/4212 257/100 |
| 2010/0123240 | A1* | 5/2010 | Sato ............... H01L 23/4334 257/692 |
| 2010/0261316 | A1* | 10/2010 | Hata ............... H01L 23/49562 438/123 |

FOREIGN PATENT DOCUMENTS

| | | |
|---|---|---|
| JP | H01-276655 A | 11/1989 |
| JP | H06-005742 A | 1/1994 |
| JP | H06-120406 A | 4/1994 |
| JP | 2001-015682 A | 1/2001 |
| JP | 2006-66813 A | 3/2006 |
| JP | 2006-351737 A | 12/2006 |
| JP | 2007-173703 A | 7/2007 |
| JP | 2008-218688 A | 9/2008 |
| JP | 2010-147053 A | 7/2010 |
| JP | 2012-156450 A | 8/2012 |
| JP | 2013-197573 A | 9/2013 |

OTHER PUBLICATIONS

An Office Action issued by Chinese Patent Office dated Sep. 19, 2017, which corresponds to Chinese Patent Application No. 201510673980.6 and is related to U.S. Appl. No. 14/790,682.

\* cited by examiner

F I G. 1 5
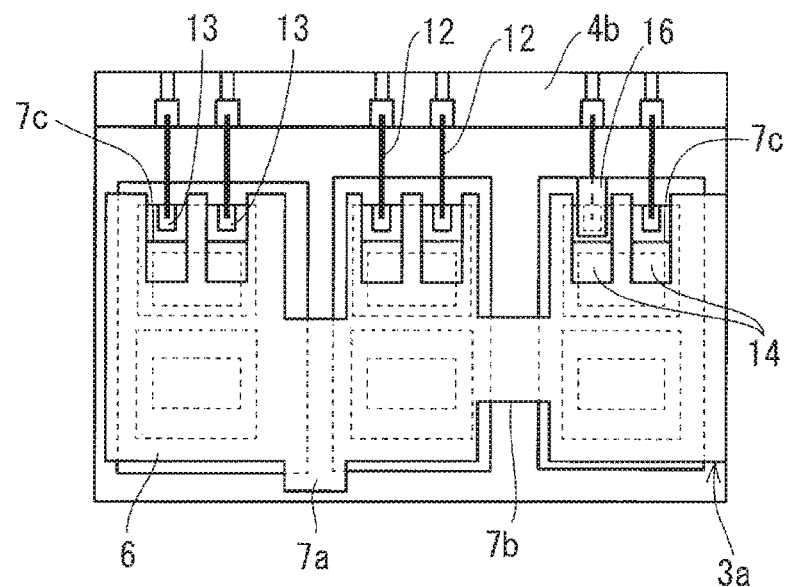
F I G. 1 6
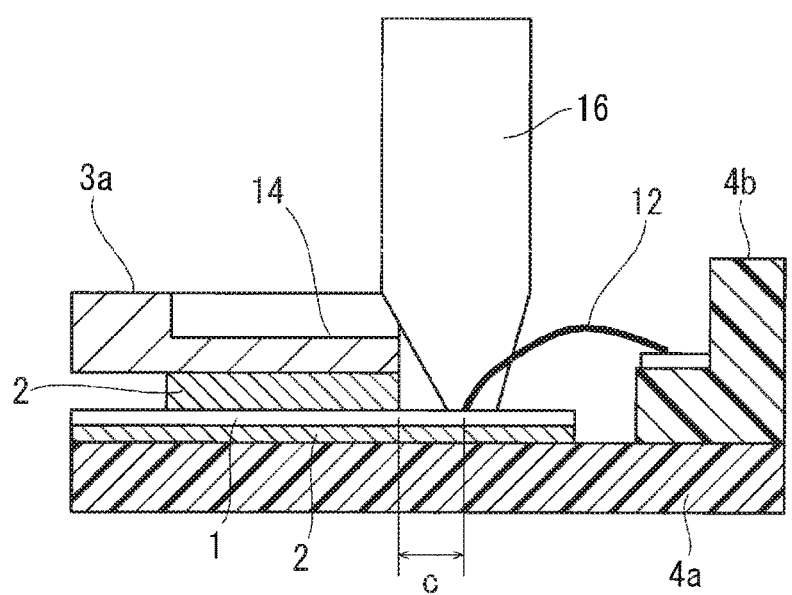

--PRIOR ART--

--PRIOR ART--

SEMICONDUCTOR DEVICE WITH A PLATE-SHAPED LEAD TERMINAL

BACKGROUND OF THE INVENTION

Field of the Invention

The present invention relates to a semiconductor device to be used in an inverter for controlling a motor of an electric car or an electric train, or a regenerative converter, Description of the Background Art A case type power semiconductor module includes a lead terminal made of Cu and used for inputting and outputting a power to and from a semiconductor element, and a signal terminal used for inputting and outputting a signal of the semiconductor element. The lead terminal is electrically bonded to the semiconductor element with a wire or solder. The signal terminal is electrically connected to the semiconductor element with a wire, and the module is sealed with a resin such as an epoxy resin, in general (refer to Japanese Patent Application Laid-Open No. 1-276655 (1989)).

When a semiconductor device is operated, or due to a thermal cycle caused by a change in ambient temperature of the semiconductor device, a stress is generated in a sealing resin near the lead terminal due to a difference in linear expansion coefficient between the lead terminal and the sealing resin in the module. Thus, as a general method for reducing the stress in the resin generated due to deformation of the lead terminal, a sealing resin having a linear expansion coefficient close to that of the lead terminal is used, or the module is sealed with a resin having a low Young's modulus such as silicone.

However, when the linear expansion coefficient of the sealing resin such as the epoxy resin is close to the linear expansion coefficient of the lead terminal made of Cu, it is away from the linear expansion coefficient of the semiconductor element or an insulating substrate. In this condition, there is a great difference in linear expansion coefficient between the sealing resin, and the semiconductor element or the insulating substrate, so that a signal wire connected to the semiconductor element could be cut due to the thermal cycle. In addition, since the many semiconductor elements are connected in parallel in the semiconductor module, the lead terminal has a linear shape, and the stress to be applied to the sealing resin is likely to concentrate on an end surface of the lead terminal, so that a crack generated in the sealing resin could propagate along the linear shape of the lead terminal. Thus, as a conceivable method, the lead terminal is to be undulated in a horizontal direction, but the problem is that an inductance deteriorates.

As another method, in the case where the silicone sealing resin which is low in Young's modulus is used, a stress is repeatedly generated due to heat generation of the semiconductor element, so that the problem is that a bonding portion fatigues soon.

SUMMARY OF THE INVENTION

It is an object of the present invention to provide a long-life and high-reliability semiconductor device by reducing a stress to a sealing resin due to expansion and contraction of a lead terminal caused by a thermal cycle, to prevent a crack from being generated in the sealing resin.

A semiconductor device according to an aspect of the present invention includes a semiconductor element having a lower surface bonded to a substrate side, and a plate-shaped lead terminal bonded to an upper surface of the semiconductor element, and having a horizontally extending portion. The horizontally extending portion in the lead terminal is bonded to the semiconductor element and includes a linearly extending portion in a planar view. The semiconductor device further includes a sealing resin that seals the semiconductor element together with the linearly extending portion in the lead terminal. The sealing resin has a linear expansion coefficient showing a value intermediate between a linear expansion coefficient of the lead terminal and a linear expansion coefficient of the semiconductor element. The lead terminal includes a recess or a projection to horizontally and partially separate the linearly extending portion into parts.

Since the lead terminal includes the recess or the projection to horizontally and partially separate the linearly extending portion into parts, a linear stress generated in the lead terminal can be dispersed, so that the stress to the sealing resin can be reduced, and the crack can be prevented from being generated in the sealing resin. In addition, since the lead terminal includes the recess or the projection, the generated crack can be prevented from continuously propagating. Furthermore, since the linear expansion coefficient of the sealing resin shows the value intermediate between the linear expansion coefficient of the lead terminal and the linear expansion coefficient of the semiconductor element, there is a small difference in linear expansion coefficient between the sealing resin and the semiconductor element, so that even when the stress is generated in the lead terminal, a signal wiring connected to the semiconductor element can be prevented from being cut. As a result, a long-life and high-reliability semiconductor device can be provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 15 is a partial plan view illustrating a state in which a bonding operation is performed in the semiconductor device according to the sixth preferred embodiment;

FIG. 16 is a partial cross-sectional view illustrating the state in which the bonding operation is performed in the semiconductor device according to the sixth preferred embodiment;

DESCRIPTION OF THE PREFERRED EMBODIMENTS

<Premise Technique>

Figure 21:
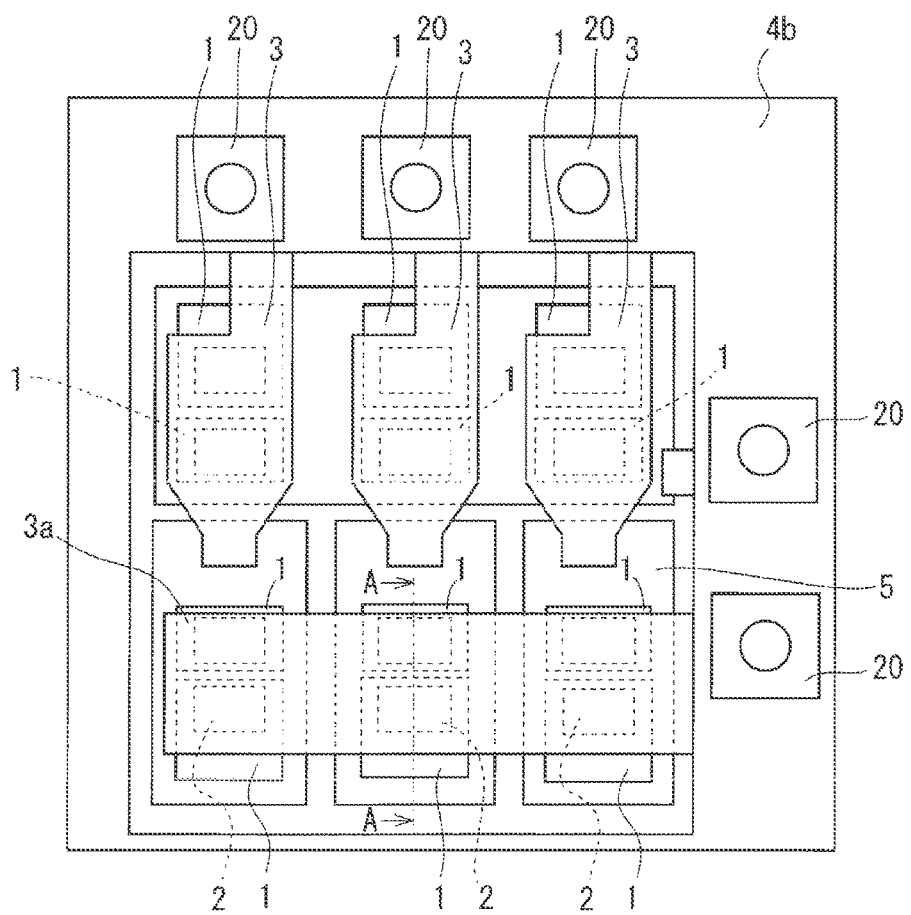
FIG. 21 is a schematic plan view of a semiconductor device according to a premise technique.
Figure 22:
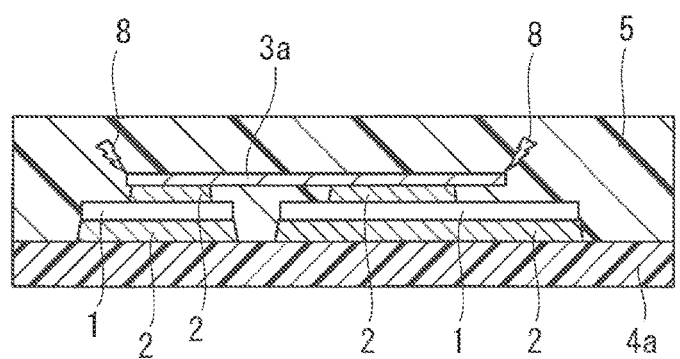
FIG. 22 is a cross-sectional view taken alone a line A-A in FIG. 21.

First, a semiconductor device according to the premise technique will be described. FIG. 21 is a schematic plan view of the semiconductor device according to the premise technique. FIG. 22 is a cross-sectional view taken along a line A-A in FIG. 21. As illustrated in FIGS. 21 and 22, the semiconductor device includes a semiconductor element 1, lead terminals 3 and 3a, and a sealing resin 5. The semiconductor device further includes an insulating substrate 4a and a case 4b. A lower surface of the semiconductor element 1 is bonded to a wiring pattern provided on an upper surface of the insulating substrate 4a with a brazing material 2 such as a solder. The lead terminals 3 and 3a are each made of Cu, formed into a plate shape, and have a horizontally extending portion. The lead terminals 3 and 3a are each connected to an upper surface of the semiconductor element 1 with the brazing material 2.

The case 4b is made of resin and provided on a side surface of the insulating substrate 4a so as to surround the semiconductor element 1 and the lead terminals 3 and 3a disposed on the insulating substrate 4a. A terminal 20 is provided on an upper surface of the case 4b, and the terminal 20 is connected to the semiconductor element 1 through a wiring installed in the case 4b. The sealing resin 5 includes an epoxy resin and is placed in the case 4b to seal the semiconductor element 1 together with the lead terminals 3 and 3a.

Referring to FIG. 21, twelve semiconductor elements 1 are disposed, and among them, the two semiconductor elements of the six semiconductor elements 1 are connected with one of the three lead terminals 3, and the six other semiconductor elements are connected with one lead terminal 3a in which the horizontally extending portion is a linearly extending portion in a planar view.

When the lead terminal 3a expands and contracts due to an operation of the semiconductor element 1 or a thermal cycle caused by a change in ambient temperature of the semiconductor device, as illustrated in FIG. 22, a stress concentrates on the sealing resin 5 which is in contact with an end of the lead terminal 3a, and a crack 8 could be generated in the sealing resin 5. Especially, when the lead terminal 3a is configured to linearly extend in the planar view, the stress linearly generates, so that the crack 8 is likely to propagate along the lead terminal 3a. According to the semiconductor device in the present invention, the crack 8 is prevented from being generated in the sealing resin 5 by reducing the stress toward the sealing resin 5 due to the expansion and contraction of the lead terminal 3a caused by the thermal cycle.

<First Preferred Embodiment>

Figure 1:
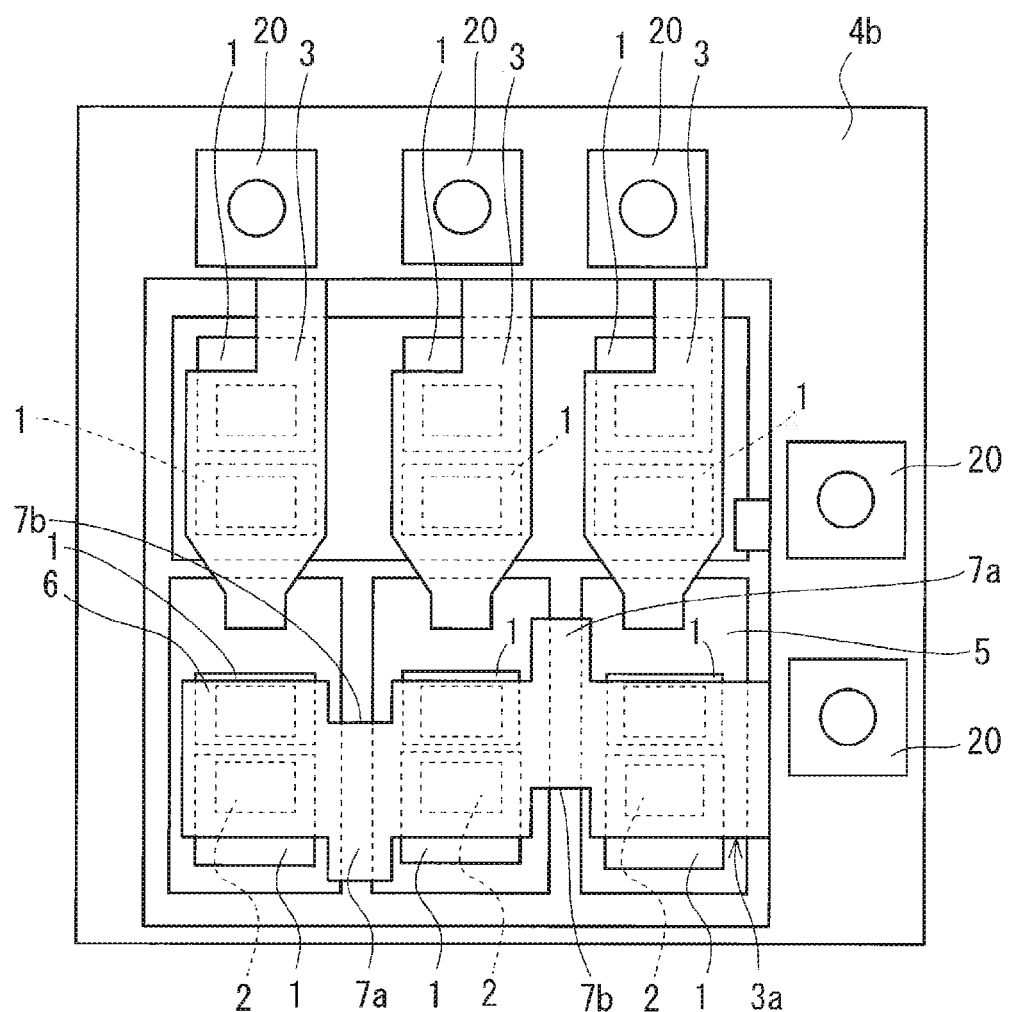
FIG. 1 is a schematic plan view of a semiconductor device according to a first preferred embodiment.

Hereinafter, the first preferred embodiment will be described with reference to the drawings. FIG. 1 is a schematic plan view of a semiconductor device according to the first preferred embodiment. Furthermore, in the first preferred embodiment, the same component as that described in the premise technique is given the same reference mark and its description is omitted, The semiconductor device according to the first preferred embodiment is a power semiconductor device, and is used in an inverter for controlling a motor of a vehicle or a regenerative converter. Furthermore, the semiconductor element 1 is a wide bandgap semiconductor element made of material such as silicon carbide (SiC) or a gallium nitride (GaN).

As illustrated in FIG. 1, according to the semiconductor device in the first preferred embodiment, a shape of the lead terminal 3a is different from that in the premise technique. More specifically, the lead terminal 3a includes a linear portion 6, a projection 7a, and a recess 7b. The linear portion 6 is the linearly extending portion in the planar view in the horizontally extending portion in the lead terminal 3a. The projection 7a is formed into a roughly rectangular shape and projects outward from the linear portion 6 in a width direction. The recess 7b is provided in the lead terminal 3a so as to correspond to the projection 7a, formed into a roughly rectangular shape, and recessed into the linear portion 6 in the width direction. The linear potion 6 is partially separated in the width direction of the linear portion 6 (horizontal direction) by the projection 7a and the recess 7b.

The lead terminal 3a for connecting the many semiconductor elements 1 includes one or more pairs of the projections 7a and the recesses 7b, in order to prevent the linear portion 6 from continuously extending. As a result, even when the lead terminal 3a expands and contracts due to the operation of the semiconductor element 1 or the change in ambient temperature of the semiconductor device, the linear portion 6 is partially separated by the projection 7a and the recess 7b provided in the lead terminal 3a, so that the stress to be applied to the sealing resin 5 is dispersed, and the crack 8 (refer to FIG. 22) can be prevented from propagating.

In addition, the lead terminals 3 and 3a are made of Cu, and the semiconductor element 1 is made of SiC or GaN. The sealing resin 5 is a resin having a linear expansion coefficient showing a value intermediate between a linear expansion coefficient of the lead terminals 3 and 3a, and a linear expansion coefficient of the semiconductor element 1. The sealing resin 5 includes an epoxy resin. Thus, there is not a great difference in linear expansion coefficient between the sealing resin 5 and the semiconductor element 1, so that a signal wiring connected to the semiconductor element 1 can be prevented from being cut even when the stress is generated in the lead terminal 3a.

Figure 2:
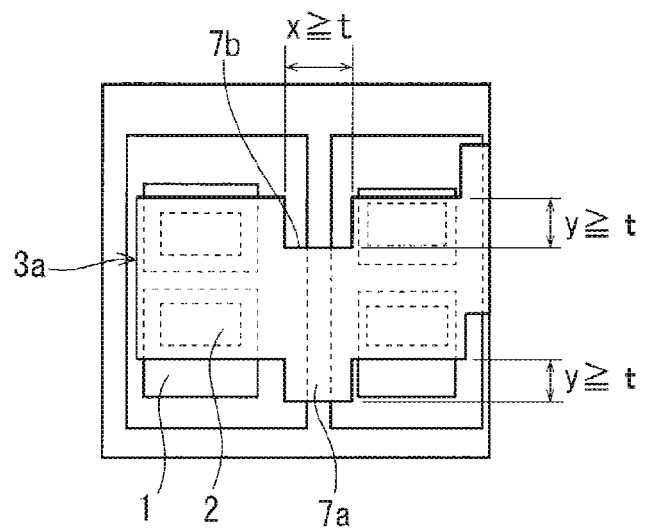
FIG. 2 is a partial plan view of the semiconductor device according to the first preferred embodiment.

Next, a dimension of each of the projection 7a and the recess 7b will be described with reference to FIG. 2. FIG. 2 is a partial plan view of the semiconductor device according to the first preferred embodiment, and illustrates a relationship between a width x and a length y of each of the projection 7a and the recess 7b, and a thickness t of the lead terminal 3a. Each of the projection 7a and the recess 7b has the width x and the length y which are equal to or larger than the thickness t of the lead terminal 3a. In the case where the width x and the length y are equal to or larger than the thickness t, in a step of forming an outline by press molding, its shape can be stabilized and its manufacturing process can be easily performed.

In addition, the solder is representatively used as the brazing material 2, but Ag paste, or another conductive connection member may be used. Furthermore, the lead terminals 3 and 3a may be made of Al other than Cu.

Figure 3:
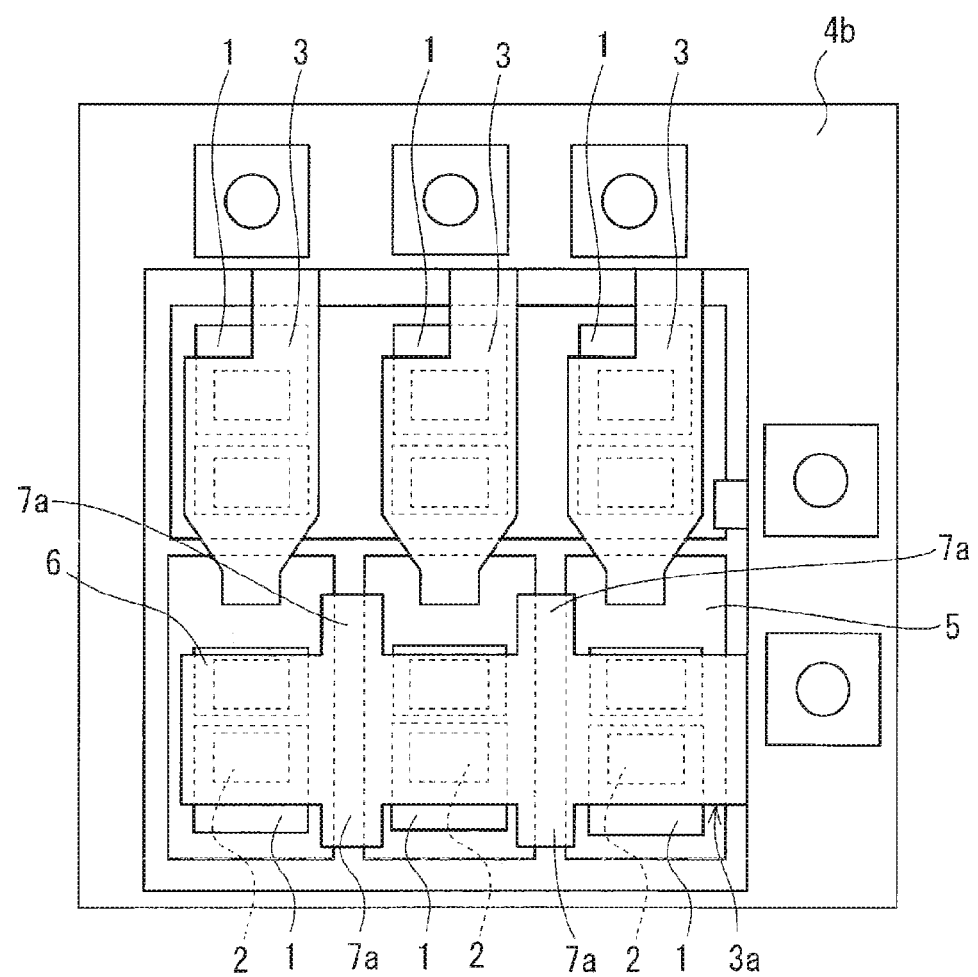
FIG. 3 is a schematic plan view of a semiconductor device according to a first variation of the first preferred embodiment.

Furthermore, the lead terminal 3a includes the projection 7a and the recess 7b in FIG. 1, but as illustrated in FIG. 3, the lead terminal 3a may only include the projections 7a. In this case, the projection 7a is formed into a roughly rectangular shape and a pair of projections 7a projects outward from the linear portion 6 in the width direction, and the lead terminal 3a includes one or more pairs of projections 7a. FIG. 3 is a schematic plan view of a semiconductor device according to a first variation of the first preferred embodiment.

Figure 4:
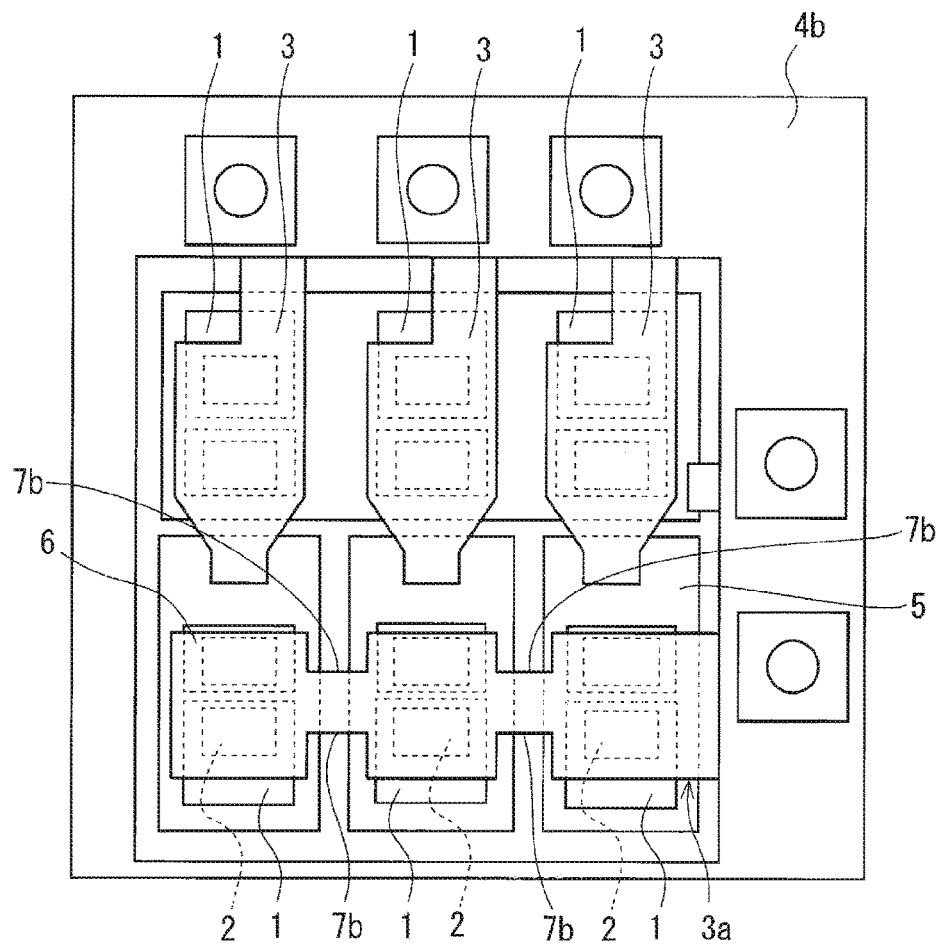
FIG. 4 is a schematic plan view of a semiconductor device according to a second variation of the first preferred embodiment.

Furthermore, as illustrated in FIG. 4, the lead terminal 3a may only include the recesses 7b. In this case, the recess 7b is formed into a roughly rectangular shape and a pair of recesses 7b is recessed into the linear portion 6 in the width direction, and the lead terminal 3a includes one or more pairs of recesses 7a. FIG. 4 is a schematic plan view of a semiconductor device according to a second variation of the first preferred embodiment.

In addition, each of the projection 7a and the recess 7b is formed into the roughly rectangular shape in the above description, but its shape may be a multistage shape, a trapezoidal shape, a semi-arc shape, or a shape combined with the above.

As described above, according to the semiconductor device in the first preferred embodiment, since the lead terminal 3a includes the recess 7b or the projection 7a to horizontally and partially separate the linearly extending portion into parts, the linear stress generated in the lead terminal 3a can be dispersed to reduce the stress toward the sealing resin 5, so that the crack 8 can be prevented from being generated in the sealing resin 5. Furthermore, since the lead terminal 3a includes the recess 7b or the projection 7a, the generated crack 8 can be prevented from continuously propagating. Furthermore, since the linear expansion coefficient of the sealing resin 5 shows the value intermediate between the linear expansion coefficient of the lead terminal 3a and the linear expansion coefficient of the semiconductor element 1, there is no great difference in linear expansion coefficient between the sealing resin 5 and the semiconductor element 1, so that even when the stress is generated in the lead terminal 3a, the signal wiring connected to the semiconductor element 1 can be prevented from being cut. As a result, a long-life and high-reliability semiconductor device can be provided.

Since each of the recess 7b and the projection 7a has the width x and the length y larger than the thickness t of the lead terminal 3a, in addition to the advantage that the partial separation in the linearly extending portion into parts is recognizable, its shape can be easily formed in press working, and a punch die has a longer life.

The semiconductor element 1 is a wide bandgap semiconductor element which can be operated at high temperature, so that when an electrode expands due to heat generated in the semiconductor element 1, the stress to be applied to the sealing resin 5 can be relaxed. As a result, a product can be operated at higher temperature.

The semiconductor device is the power semiconductor device to be used in the inverter for controlling the motor of the vehicle or the regenerative converter, so that while the semiconductor device is required to be high in quality and high in reliability, the sealing resin 5 can be prevented from being damaged, and predetermined quality and reliability can be obtained.

<Second Preferred Embodiment>

Figure 5:
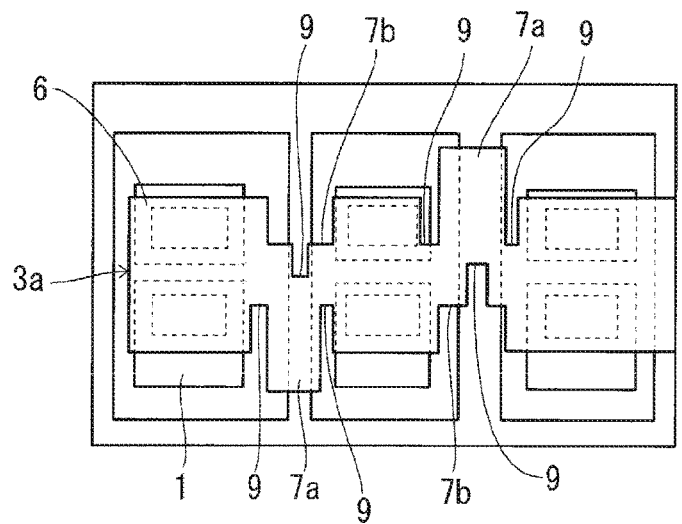
FIG. 5 is a partial plan view of a semiconductor device according to a second preferred embodiment.

Next, a semiconductor device according to the second preferred embodiment will be described. FIG. 5 is a partial plan view of the semiconductor device according to the second preferred embodiment. In addition, in the second preferred embodiment, the same component as that described in the first preferred embodiment is given the same reference d its description omitted.

As illustrated in FIG. 5, according to the second preferred embodiment, a slit 9 is provided in a portion leading to the projection 7a or the recess 7b in the lead terminal 3a. More specifically, the slits 9 are provided in side portions of the projection 7a in the lead terminal 3a, and in an inner portion leading to the recess 7b in the lead terminal 3a in the width direction. In addition, the slit 9 is formed into a roughly rectangular shape, and has a width equal to or larger than the thickness t of the lead terminal 3a.

Due to the slits 9 further provided in the lead terminal 3a, it is possible to further suppress the linear propagation of the stress generated in the sealing resin 5. Furthermore, a planar movement of the lead terminal 3a due to its thermal expansion can be easily absorbed. In addition, the description has been given to the case where the slit 9 is formed into the roughly rectangular shape, but its shape may be a multistage shape, a trapezoidal shape, a semi-arc shape, or a shape combined with the above. In this case also, the same advantage as that described above can be obtained.

As described above, according to the semiconductor device in the second preferred embodiment, the lead terminal 3a further includes the slit 9 having the width equal to or larger than the thickness t of the lead terminal 3a and provided in the portion leading to the recess 7b or the projection 7a in the lead terminal 3a. Therefore, in a case where the lead terminal 3a is deformed in a longitudinal direction due to the thermal expansion of the lead terminal 3a, the slit 9 can absorb the movement of the lead terminal 3a, so that it is possible to further suppress the linear propagation of the stress generated in the sealing resin 5. Thus, the stress generated in the sealing resin 5 can be relaxed. Furthermore, the slit 9 can be also easily provided in the lead terminal 3a by press working, which ensures workability.

<Third Preferred Embodiment>

Figure 6:
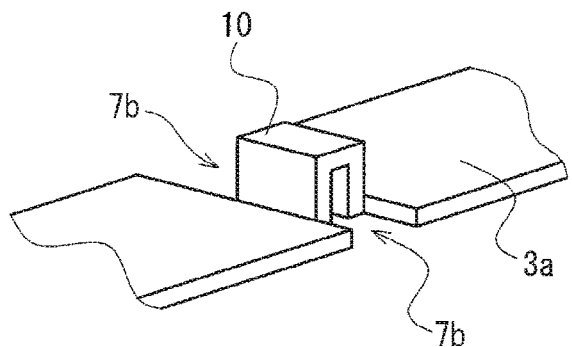
FIG. 6 is a partial perspective view of a bend portion of a lead terminal in a semiconductor device according to a third preferred embodiment.

Next, a semiconductor device according to the third preferred embodiment will be described. FIG. 6 is a partial perspective view of a bend portion 10 in the lead terminal 3a of the semiconductor device according to the third preferred embodiment. In addition, in the third preferred embodiment, the same component as that described in the first or second preferred embodiment is given the same reference mark and its description is omitted.

As illustrated in FIG. 6, according to the third preferred embodiment, the lead terminal 3a includes the bend portion 10 in a portion corresponding to the recess 7b. The bend portion 10 is formed by upwardly bending an inside portion leading to the recess 7b in the lead terminal 3a in the width direction.

Due to the upwardly-bent bend portion 10 provided in the inside portion leading to the recess 7b in the lead terminal 3a in the width direction, the linear portion 6 in the lead terminal 3a can be partially separated in a horizontal direction and a vertical direction. Therefore, the stress generated in the sealing resin 5 can be dispersed. Furthermore, due to the bend portion 10 provided in the lead terminal 3a, an amount of the displacement of the lead terminal 3a due to the thermal expansion can be reduced, so that the stress generated in the sealing resin 5 can be reduced similarly to the above.

Furthermore, due to the upwardly-bent bend portion 10, a lower space of the lead terminal 3a can be large, so that resin fluidity can be improved when the resin is injected into the semiconductor device at the time of resin sealing. As a result, void accumulation and a filling defect can be prevented from occurring in the sealing resin 5.

The description has been given to the case where the recess 7b in the lead terminal 3a has the roughly rectangular shape, but even when its shape is a multistage shape, a trapezoidal shape, a semi-arc shape, or a shape combined with the above as described in the first or second preferred embodiment, the similar advantage can be obtained. In addition, while the description has been given to the case where the bend portion 10 is provided in the inside portion leading to the recess 7b in the lead terminal 3a in the width direction, another bend portion 10 may be formed by bending a portion corresponding to the projection 7a illustrated in FIG. 3, that is, by bending the pair of projections 7a and the inside portion leading to the projections 7a in the lead terminal 3a in the width direction.

As described above, according to the semiconductor device in the third preferred embodiment, since the lead terminal 3a further includes the upwardly-bent bend portion 10 in the portion corresponding to the recess 7b or the projection 7a, the linear portion 6 in the lead terminal 3a can be partially separated in the horizontal direction and the vertical direction, so that the stress generated in the sealing resin 5 can be prevented from propagating linearly. Furthermore, due to the bend portion 10, the deformation of the lead terminal 3a due to the thermal expansion can be more absorbed. In addition, due to the upwardly-bent bend portion 10, flexibility in design can be increased. Thus, a fluid path of the sealing resin 5 can be surely provided, and quality in sealing with sealing resin 5 can be improved.

<Fourth Preferred Embodiment>

Figure 7:
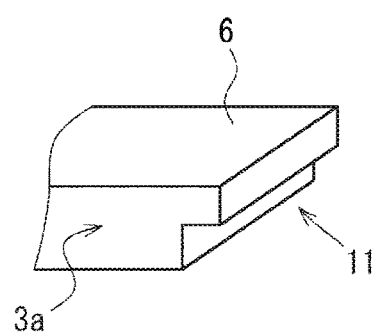
FIG. 7 is a partial perspective view of a lead terminal in a semiconductor device according to a fourth preferred embodiment.

Next, a semiconductor device according to the fourth preferred embodiment will be described. FIG. 7 is a partial perspective view of the lead terminal 3a of the semiconductor device according to the fourth preferred embodiment. In addition, in the fourth preferred embodiment, the same component as that described in any one of the first to third preferred embodiments is given the same reference mark and its description is omitted.

As illustrated in FIG. 7, according to the fourth preferred embodiment, an end 11 of the lead terminal 3a in a longitudinal direction is formed into a step shape. More specifically, the end 11 of the linear portion 6 in the lead terminal 3a in the longitudinal direction is formed into the one-stage step shape in which a lower portion is shorter than an upper portion in the longitudinal direction.

Due to the step-shaped end 11 of the linear portion 6 in the lead terminal 3a in the longitudinal direction, a stress concentrating on a corner of the end of the lead terminal 3a in the longitudinal direction can be dispersed to a corner of the step-shaped end 11, so that the stress to be generated in the sealing resin 5 can he reduced.

As described above, according to the semiconductor device in the fourth preferred embodiment, since the end 11 of the lead terminal 3a in the longitudinal direction is formed into the step shape, it is possible to relax the stress generated in the sealing resin 5 due to the stress concentrating on the corner of the end of the lead terminal 3a in the longitudinal direction. Furthermore, due to the step-shaped end 11 of the linear portion 6 in the lead terminal 3a in the longitudinal direction, a predetermined resin thickness can be ensured in the end 11 of the lead terminal 3a, so that resin strength of the sealing resin 5 can be improved, and fluidity of the resin to the end 11 of the lead terminal 3a can be ensured at the time of resin sealing.

Figure 8:
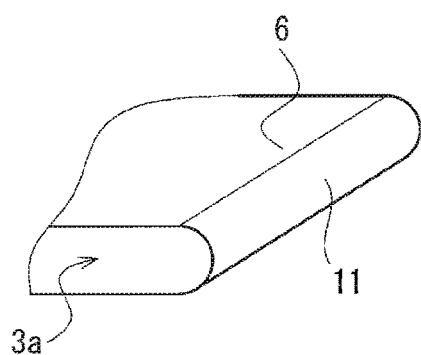
FIG. 8 is a partial perspective view of a lead terminal in a semiconductor device according to a first variation of the fourth preferred embodiment.
Figure 9:
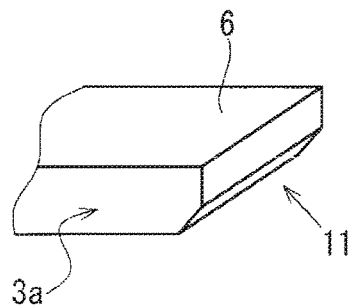
FIG. 9 is a partial perspective view of a lead terminal in a semiconductor device according to a second variation of the fourth preferred embodiment.

In addition, the one-stage step shape is illustrated in FIG. 7, but a multiple-stage step shape may be used. Furthermore, as illustrated in FIG. 8, the end 11 of the linear portion 6 in the lead terminal 3a in the longitudinal direction may be formed into an arc shape, or as illustrated in FIG. 9, into a chamfered shape. Here, FIG. 8 is a partial perspective view of the lead terminal 3a of a semiconductor device according to a first variation of the fourth preferred embodiment, and FIG. 9 is a partial perspective view of the lead terminal 3a of a semiconductor device according to a second variation of the fourth preferred embodiment. In each of these cases also, an advantage similar to the above can be obtained.

<Fifth Preferred Embodiment>

Figure 10:
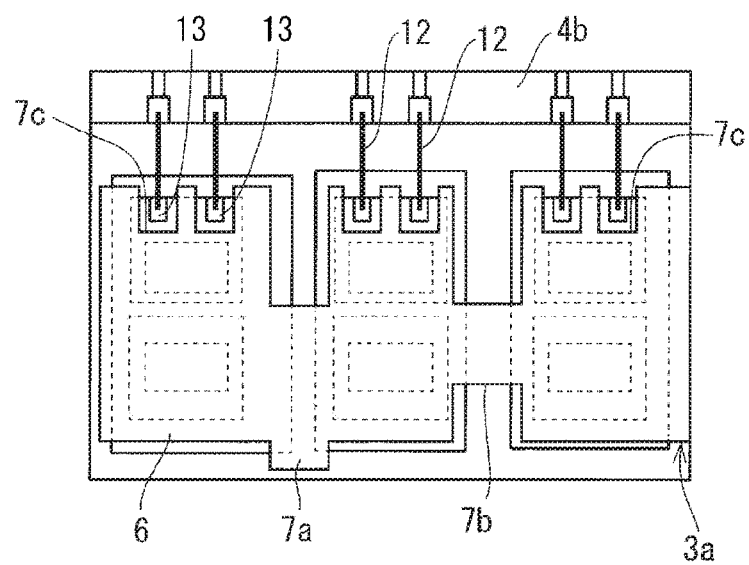
FIG. 10 is a partial plan view of a semiconductor device according to a fifth preferred embodiment.
Figure 11:
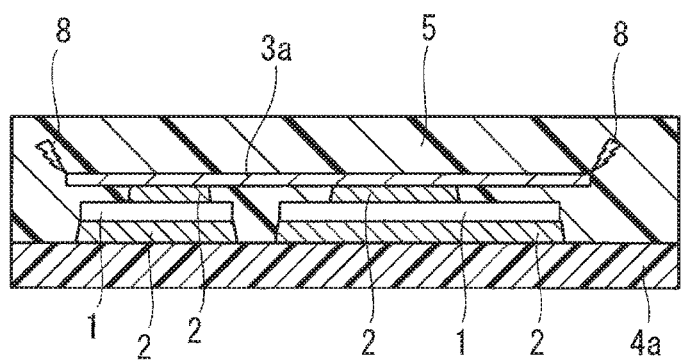
FIG. 11 is a partial cross-sectional view of the semiconductor device according to the fifth preferred embodiment.

Next, a semiconductor device according to the fifth preferred embodiment will be described. FIG. 10 is a partial plan view of the semiconductor device according to the fifth preferred embodiment, and FIG. 11 is a partial cross-sectional view of the semiconductor device according to the fifth preferred embodiment. In addition, in the fifth preferred embodiment, the same component as that described in any one of the first to fourth preferred embodiments is given the same reference mark and its description is omitted.

As illustrated in FIG. 10, according to the fifth preferred embodiment, the lead terminal 3a is fainted so as to cover a whole upper surface of the semiconductor element 1 except for a portion of a wire bonding pad 13 connected to a signal wiring 12. More specifically, the lead terminal 3a in the fifth preferred embodiment has an outline larger than those in the first to fourth preferred embodiments when planarly viewed. In addition, a recess 7c is provided in the lead terminal 3a over the wire bonding pad 13 so that the wire bonding pad 13 is exposed.

As illustrated in FIG. 10, since the upper surface of the semiconductor element 1 is covered with the lead terminal 3a, the stress generated due to the thermal expansion of the lead terminal 3a is applied from the end of the lead terminal 3a to the sealing resin 5. Thus, even if the crack 8 is generated as illustrated in FIG. 11, it does not propagate to the upper surface of the semiconductor element 1. Furthermore, since the recess 7c is provided in the lead terminal 3a over the wire bonding pad 13 so as to only expose the wire bonding pad 13, the linear portion 6 in the lead terminal 3 can be further horizontally and partially separated.

As described above, according to the semiconductor device in the fifth preferred embodiment, the lead terminal 3a is formed so as to cover the whole upper surface of the semiconductor element 1 except for the portion connected to the signal wiring 12, so that even if the crack 8 is generated in the sealing resin 5 due to the thermal expansion of the lead terminal 3a, the crack 8 is prevented from propagating to the upper surface side of the semiconductor element 1 due to the lead terminal 3a, and the semiconductor element 1 can be prevented from being damaged. Furthermore, compared with the first to fourth preferred embodiments, since the lead terminal 3a is large in size, a current density is reduced, and heat generation of the lead terminal 3a is reduced, so that an effect due to the thermal expansion can be alleviated.

<Sixth Preferred Embodiment>

Figure 12:
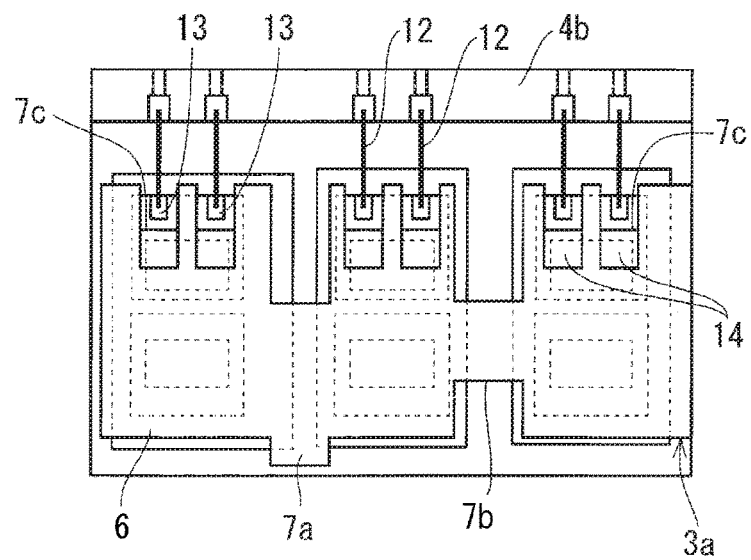
FIG. 12 is a partial plan view of a semiconductor device according to a sixth preferred embodiment.
Figure 13:
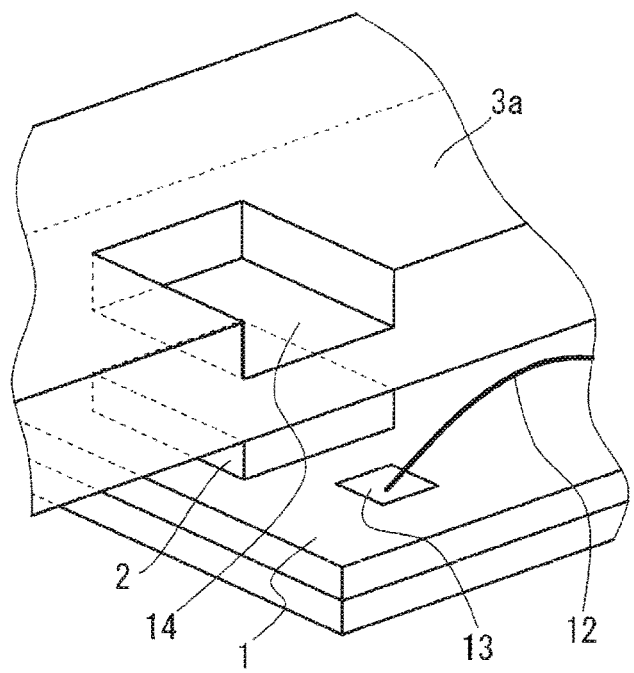
FIG. 13 is a partial perspective view illustrating a structure of a lead terminal in the semiconductor device according to the sixth preferred embodiment.

Next, a semiconductor device according to the sixth preferred embodiment will be described. FIG. 12 is a partial plan view of the semiconductor device according to the sixth preferred embodiment, and FIG. 13 is a partial perspective view illustrating a structure of the lead terminal 3a in the semiconductor device according to the sixth preferred embodiment. In addition, in the sixth preferred embodiment, the same component as that described in any one of the first to fifth preferred embodiments is given the same reference mark and its description is omitted.

As illustrated in FIGS. 12 and 13, according to the sixth preferred embodiment, the lead terminal 3a further includes a dent portion 14 dented in a stepped shape toward an upper surface side of the semiconductor element 1 adjacent to the portion connected to the signal wiring 12 (the portion of the wire bonding pad 13) in the upper surface of the semiconductor element 1. More specifically, the stepped dent portion 14 is provided in a position adjacent to the recess 7c provided to expose the wire bonding pad 13, in the lead terminal 3a.

Figure 14:
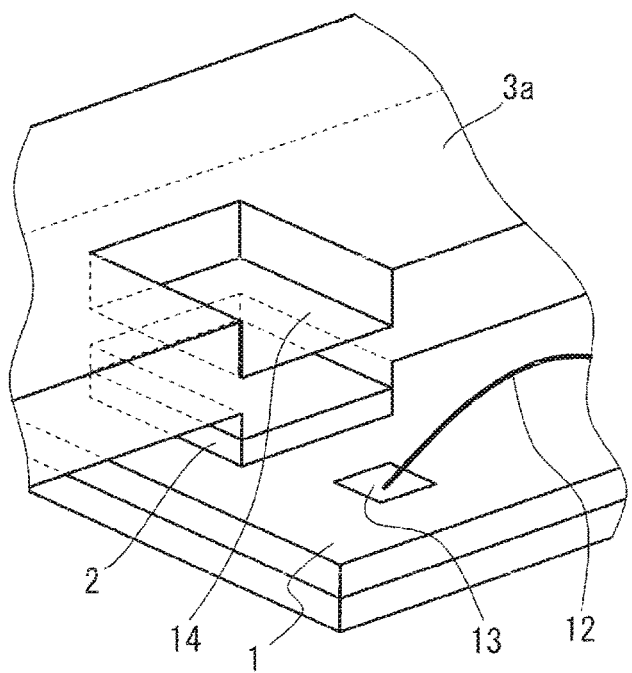
FIG. 14 is a partial perspective view illustrating a structure of a lead terminal in a semiconductor device according to a variation of the sixth preferred embodiment.

FIG. 13 illustrates the dent portion 14 formed by denting only a planar portion for the dent portion 14 in the lead terminal 3a, while FIG. 14 illustrates a stepped dent portion 14 formed by half cutting. Here, FIG. 14 is a partial perspective view illustrating a structure of the lead terminal 3a of a semiconductor device according to a variation of the sixth preferred embodiment. In addition, FIGS. 13 and 14 each omit the recess 7c adjacent to the dent portion 14 in the lead terminal 3a in order to easily see the illustration.

Next, an action and an advantage of the semiconductor device according to the sixth preferred embodiment will be described. FIG. 15 is a partial plan view illustrating a state in which a bonding operation is performed in the semiconductor device in the sixth preferred embodiment, FIG. 16 is a partial cross-sectional view illustrating the state in which the bonding operation is performed in the semiconductor device in the sixth preferred embodiment, and FIG. 17 is a partial cross-sectional view illustrating a state in which the bonding operation is performed in a semiconductor device not having the dent portion 14 in the sixth preferred embodiment.

As illustrated in FIGS. 15 and 16, when the bonding operation is performed with a wedge tool 16, a side portion of the wedge tool 16 is located in the stepped dent portion 14 provided in the lead terminal 3a, so that interference can be avoided between the lead terminal 3a and the wedge tool 16.

Figure 17:
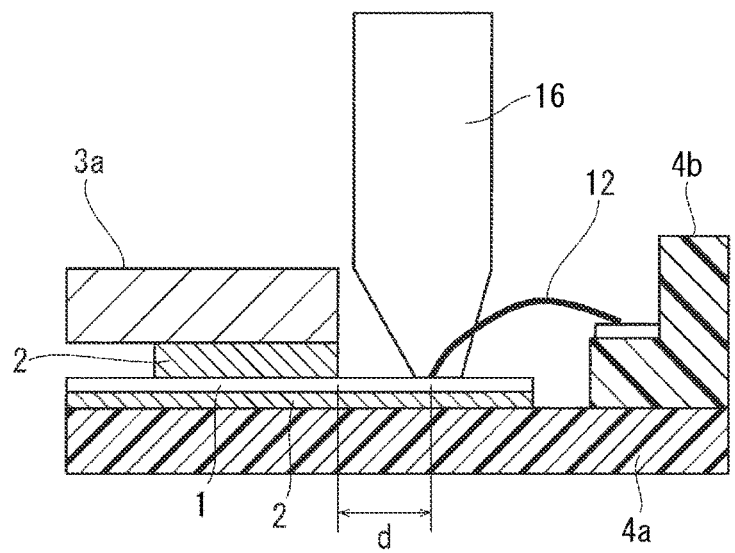
FIG. 17 is a partial cross-sectional view illustrating a state in which a bonding operation is performed in a semiconductor device not having a dent portion according to the sixth preferred embodiment.

Meanwhile, as illustrated in FIG. 17, in the case the dent portion 14 is not provided in the lead terminal 3a, a relationship in distance between the side surface of the lead terminal 3a and the wire bonding pad is c<d. This means that the wedge tool 16 interferes with the lead terminal 3a if its positional relationship is set similarly to the case having the dent portion 14. Here, c represents a distance between the side surface of the lead terminal 3a and the wire bonding pad 13 in the case having the dent portion 14, and d represent a distance between the side surface of the lead terminal 3a and the wire bonding pad 13 in the case not having the dent portion 14.

Due to the dent portion 14 provided in the lead terminal 3a, the interference can be avoided between the lead terminal 3a and the wedge tool 16, so that the recess 7c can be minimized in size, and the semiconductor element 1 can be largely covered with the lead terminal 3a. Furthermore, due to the dent portion 14, the linear portion 6 in the lead terminal 3a can be partially separated, so that it is possible to suppress the propagation of the stress generated in the sealing resin 5.

As described above, according to the semiconductor device in the sixth preferred embodiment, the lead terminal 3a further includes the dent portion 14 dented in the stepped shape toward the upper surface side of the semiconductor element 1 adjacent to the portion connected to the signal wiring 12 in the upper surface of the semiconductor element 1. Therefore, the recess 7c can be minimized in size. Furthermore, in the case where the dent portion 14 is formed by half cutting, the lead terminal 3a can be wholly separated from the insulating substrate 4a, and there is a large clearance between the lead terminal 3a and the insulating substrate 4a, so that the fluidity of the resin can be ensured.

<Seventh Preferred Embodiment>

Figure 18:
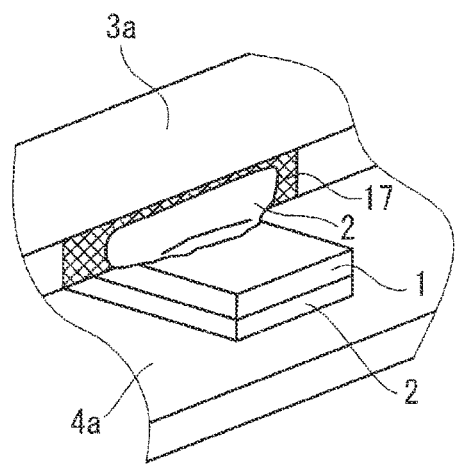
FIG. 18 is a partial perspective view of a semiconductor device according to a seventh preferred embodiment.
Figure 19:
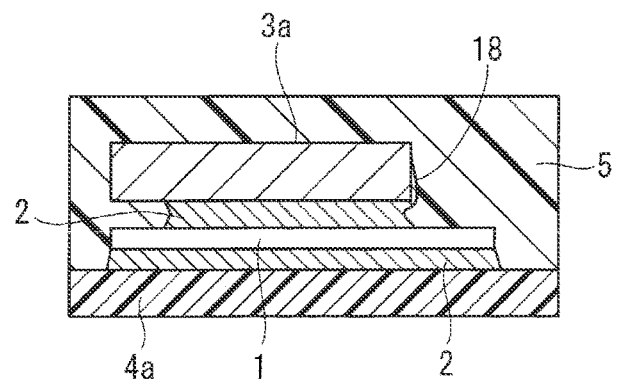
FIG. 19 is a partial cross-sectional view of the semiconductor device according to the seventh preferred embodiment.

Next, a semiconductor device according to the seventh preferred embodiment will be described. FIG. 18 is a partial perspective view of the semiconductor device according to the seventh preferred embodiment, and FIG. 19 is a partial cross-sectional view of the semiconductor device according to the seventh preferred embodiment. In addition, in the seventh preferred embodiment, the same component as that described in any one of the first to sixth preferred embodiments is given the same reference mark and its description is omitted.

As illustrated in FIG. 18, according to the seventh preferred embodiment, the lead terminal 3a has a surface-treated side surface in a portion connected to the semiconductor element 1, to improve wettability of the brazing material 2. Here, this surface treatment is Ni plating, so that a Ni thin film 17 is formed on the side surface in the portion connected to the semiconductor element 1, in the lead terminal 3a. In addition, the surface treatment may be Au plating, Ag plating, or a treatment by use of a flux, other than the Ni plating. Furthermore, the surface treatment may be a treatment to modify the surface such as chemical polishing.

As illustrated in FIG. 19, due to the improvement in wettability on the side surface in the portion connected to the semiconductor element 1, in the lead terminal 3a, the brazing material 2 for bonding the semiconductor element 1 wets up along the side surface. Since adhesiveness is low between the brazing material 2 and the sealing resin 5, an interface 18 is generated between the brazing material 2 and the sealing resin 5 thereby dispersing the stress generated in the sealing resin 5.

As described above, according to the semiconductor device in the seventh preferred embodiment, since the lead terminal 3a has the surface-treated side surface in the portion connected to the semiconductor element 1, to improve the wettability, the brazing material 2 for bonding the semiconductor element 1 wets up along the side surface, so that adhesiveness is lowered between the side surface of the lead terminal 3a and the sealing resin 5. As a result, displacement of the lead terminal 3a due to the thermal expansion is separated from the sealing resin 5, and the stress can be prevented from being generated in the sealing resin 5.

<Eighth Preferred Embodiment>

Figure 20:
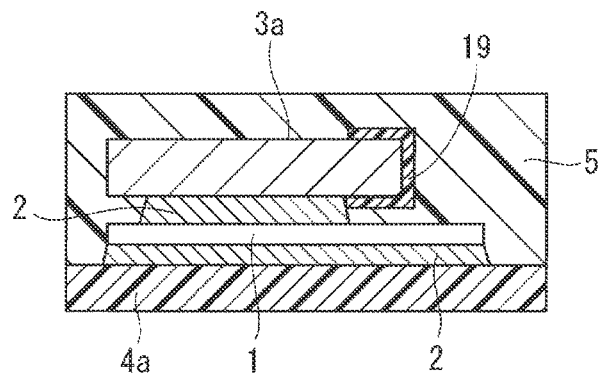
FIG. 20 is a partial cross-sectional view of a semiconductor device according to an eighth preferred embodiment.

Next, a semiconductor device according to the eighth preferred embodiment will be described. FIG. 20 is a partial cross-sectional view of the semiconductor device according to the eighth preferred embodiment. In addition, in the eighth preferred embodiment, the same component as that described in any one of the first to seventh preferred embodiments is given the same reference mark and its description is omitted.

As illustrated in FIG. 20, according to the eighth preferred embodiment, the semiconductor device further includes a terminal cover 19 for covering the side surface in the portion connected to the semiconductor element 1, in the lead terminal 3a. More specifically, the terminal cover 19 is a U-shaped cover made of Teflon (registered trademark) resin, and mounted on a side portion including the side surface in the portion connected to the semiconductor element 1, in the lead terminal 3a. Here, the terminal cover 19 may be made of thermoplastic resin such as ABS, PC, PS, or PPS, or metal material such as SUS304, other than the Teflon (registered trademark) resin.

After the terminal cover 19 has been mounted on the side portion of the lead terminal 3a, the sealing resin 5 is supplied, so that the displacement of the lead terminal 3a due to the thermal expansion or contraction can be separated from the sealing resin 5. Therefore, the stress to be applied to the sealing resin 5 can be minimized. Thus, the crack 8 can be prevented from being generated in the sealing resin 5. In addition, the semiconductor device mainly made of silicon carbide can be operated at higher temperature. That is, the sealing resin 5 can realize a favorable sealed state, so that the semiconductor device can be more excellent in reliability.

As described above, the semiconductor device according to the eighth preferred embodiment further includes the terminal cover 19 which covers the side surface in the portion connected to the semiconductor element 1, in the lead terminal 3a, so that an interface is intentionally formed between the lead terminal 3a and the sealing resin 5, so that the stress to be applied to the sealing resin 5 can be reduced.

While the invention has been shown and described in detail, the foregoing description is in all aspects illustrative and not restrictive. It is therefore, understood that numerous modifications and variations can be devised without departing from the scope of the invention.

What is claimed is:

1. A semiconductor device comprising:
    a plurality of adjacent semiconductor elements having respective lower surfaces bonded to a substrate side;
    a plate-shaped lead terminal bonded to upper surfaces of said semiconductor elements, and having a horizontally extending portion, said horizontally extending portion in said lead terminal being bonded to each of said plurality of semiconductor elements, said lead terminal including a linearly extending portion in a planar view;
    a sealing resin that seals said semiconductor elements together with said linearly extending portion of said lead terminal, wherein
    said lead terminal comprises a recess and a projection, each entirely disposed between adjacent semiconductor elements to horizontally and partially separate said linearly extending portion into parts.

2. The semiconductor device according to claim 1, wherein
    said lead terminal further comprises a slit having a width equal to or larger than the thickness of said lead terminal, and formed in a portion leading to said recess or said projection in said lead terminal.

3. The semiconductor device according to claim 1, wherein
    said lead terminal further comprises an upwardly-bent bend portion formed in a portion corresponding to said recess or said projection.

4. The semiconductor device according to claim 1, wherein
    said lead terminal has a step-shaped end in a longitudinal direction.

5. The semiconductor device according to claim 1, wherein
    said lead terminal wholly covers said upper surface of said semiconductor element except for a portion connected to a signal wiring.

6. The semiconductor device according to claim 5, wherein
    said lead terminal further comprises a dent portion dented in a stepped shape toward said upper surface side of said semiconductor element adjacent to the portion connected to the signal wiring in said upper surface of said semiconductor element.

7. The semiconductor device according to claim 1, wherein
    said lead terminal has a surface-treated side surface in a portion connected to said semiconductor element to improve wettability.

8. The semiconductor device according to claim 1, further comprising:
    a terminal cover that covers the side surface in the portion connected to said semiconductor element, in said lead terminal.

9. The semiconductor device according to claim 1, wherein
    said semiconductor element is a wide bandgap semiconductor element.

10. The semiconductor device according to claim 1, wherein
    said semiconductor device is a power semiconductor device to be used in an inverter for controlling a motor of a vehicle, or a regenerative converter.

11. A semiconductor device comprising:
    a semiconductor element having a lower surface bonded to a substrate side;
    a plate-shaped lead terminal bonded to an upper surface of said semiconductor element, and having a horizontally extending portion, said horizontally extending portion in said lead terminal being bonded to said semiconductor element and including a linearly extending portion in a planar view;
    a sealing resin that seals said semiconductor element together with said linearly extending portion of said lead terminal, wherein
    said sealing resin has a linear expansion coefficient showing a value between a linear expansion coefficient of said lead terminal and a linear expansion coefficient of said semiconductor element,
    said lead terminal comprises a recess or a projection to horizontally and partially separate said linearly extending portion into parts, wherein
    said recess or said projection has a width that is equal to or larger than a thickness of said lead terminal.

12. A semiconductor device comprising:
    a semiconductor element having a lower surface bonded to a substrate side;

a plate-shaped lead terminal having a lower portion bonded to an upper surface of said semiconductor element and an upper portion opposite to the lower portion, and an end of said lead terminal in a longitudinal direction is formed into a step shape in which the lower portion is shorter than the upper portion in said longitudinal direction; and a sealing resin that seals said semiconductor element together with said end of said lead terminal that is formed into said step shape, wherein said sealing resin encapsulates the upper portion of said plate-shaped lead terminal.

13. A semiconductor device comprising:

a plurality of adjacent semiconductor elements having respective lower surfaces bonded to a substrate side;

a plate-shaped lead terminal bonded to upper surfaces of said semiconductor elements, and having a horizontally extending portion, said horizontally extending portion in said lead terminal being bonded to each of said plurality of semiconductor elements, said lead terminal including a linearly extending portion in a planar view;

a sealing resin that seals said semiconductor elements together with said linearly extending portion of said lead terminal, wherein said lead terminal comprises a first recess provided in one side surface of said lead terminal and a second recess provided in the other side surface of said lead terminal, each entirely disposed between adjacent semiconductor elements to horizontally and partially separate said linearly extending portion into parts.

14. A semiconductor device comprising:

a semiconductor element having a lower surface bonded to a substrate side;

a plate-shaped lead terminal having a lower portion bonded to an upper surface of said semiconductor element and an upper portion opposite to the lower portion, and an end of said lead terminal in a longitudinal direction is formed into a multiple-stage step shape in which the lower portion is shorter than the upper portion in said longitudinal direction; and a sealing resin that seals said semiconductor element together with said end of said lead terminal that is formed into said multiple-stage step shape, wherein said sealing resin encapsulates the upper portion of said plate-shaped lead terminal.

15. A semiconductor device comprising:

a semiconductor element having a lower surface bonded to a substrate side;

a plate-shaped lead terminal having a lower portion bonded to an upper surface of said semiconductor element and an upper portion opposite to the lower portion, and an end of said lead terminal in a longitudinal direction is formed into an arc shape; and a sealing resin that seals said semiconductor element together with said end of said lead terminal that is formed into said arc shape, wherein said sealing resin encapsulates the upper portion of said plate-shaped lead terminal.

16. A semiconductor device comprising:

a semiconductor element having a lower surface bonded to a substrate side;

a plate-shaped lead terminal having a lower portion bonded to an upper surface of said semiconductor element and an upper portion opposite to the lower portion, and an end of said lead terminal in a longitudinal direction is formed into a chamfered shape in which the lower portion is shorter than the upper portion in said longitudinal direction; and a sealing resin that seals said semiconductor element together with said end of said lead terminal that is formed into said chamfered shape, wherein said sealing resin encapsulates the upper portion of said plate-shaped lead terminal.

\* \* \* \* \*